(12) United States Patent
Lee et al.

(10) Patent No.: US 10,109,717 B2
(45) Date of Patent: Oct. 23, 2018

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Jung Han Lee, Anyang-si (KR); Myung Il Kang, Yongin-si (KR); Jae Hwan Lee, Seongnam-si (KR); Sun Wook Kim, Seongnam-si (KR); Seong Ju Kim, Suwon-si (KR); Sung Jin Park, Hwaseong-si (KR); Hong Seon Yang, Seongnam-si (KR); Joo Hee Jung, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/596,152

(22) Filed: May 16, 2017

(65) Prior Publication Data
US 2018/0130890 A1 May 10, 2018

(30) Foreign Application Priority Data
Nov. 9, 2016 (KR) ........................ 10-2016-0148737

(51) Int. Cl.
| H01L 29/76 | (2006.01) |
| H01L 29/94 | (2006.01) |
| H01L 29/423 | (2006.01) |
| H01L 29/78 | (2006.01) |
| H01L 29/66 | (2006.01) |
| H01L 29/49 | (2006.01) |

(52) U.S. Cl.
CPC ...... *H01L 29/4236* (2013.01); *H01L 29/4966* (2013.01); *H01L 29/6656* (2013.01); *H01L 29/66795* (2013.01); *H01L 29/7855* (2013.01)

(58) Field of Classification Search
CPC .............. H01L 29/4236; H01L 29/785; H01L 29/66795; H01L 29/7856
USPC ........................................................ 257/331
See application file for complete search history.

(56) References Cited

U.S. PATENT DOCUMENTS

| 8,603,894 | B2 | 12/2013 | Majumdar et al. |
| 8,642,417 | B2 | 2/2014 | Cheng et al. |
| 8,809,872 | B2 | 8/2014 | Cai et al. |
| 8,963,258 | B2 | 2/2015 | Yu et al. |
| 9,293,587 | B2 | 3/2016 | Jacob et al. |
| 9,343,300 | B1 | 5/2016 | Jacob et al. |
| 2008/0042219 | A1 | 2/2008 | Booth, Jr. et al. |
| 2014/0369115 | A1* | 12/2014 | Kim ............... H01L 29/78 365/182 |
| 2016/0027644 | A1 | 1/2016 | Tsai et al. |

(Continued)

*Primary Examiner* — Theresa T Doan
(74) *Attorney, Agent, or Firm* — Lee & Morse, P.C.

(57) ABSTRACT

A semiconductor device including a first fin protruding on a substrate and extending in a first direction; a first gate electrode on the first fin, the first gate electrode intersecting the first fin; a first trench formed within the first fin at a side of the first gate electrode; a first epitaxial layer filling a portion of the first trench, wherein a thickness of the first epitaxial layer becomes thinner closer to a sidewall of the first trench; and a second epitaxial layer filling the first trench on the first epitaxial layer, wherein a boron concentration of the second epitaxial layer is greater than a boron concentration of the first epitaxial layer.

10 Claims, 20 Drawing Sheets

(56) References Cited

U.S. PATENT DOCUMENTS

2016/0181368 A1 6/2016 Weeks
2016/0343858 A1* 11/2016 Kim .................... H01L 29/7848

* cited by examiner

SEMICONDUCTOR DEVICE AND METHOD FOR FABRICATING THE SAME

CROSS-REFERENCE TO RELATED APPLICATION

Korean Patent Application No. 10-2016-0148737 filed on Nov. 9, 2016 in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same.

2. Description of the Related Art

As one of the scaling technologies to increase the density of semiconductor devices, a multi-gate transistor has been suggested, in which silicon bodies in a fin or nano wire shape are formed on a substrate, with gates then being formed on surfaces of the silicon bodies.

SUMMARY

The embodiments may be realized by providing a semiconductor device including a first fin protruding on a substrate and extending in a first direction; a first gate electrode on the first fin, the first gate electrode intersecting the first fin; a first trench formed within the first fin at a side of the first gate electrode; a first epitaxial layer filling a portion of the first trench, wherein a thickness of the first epitaxial layer becomes thinner closer to a sidewall of the first trench; and a second epitaxial layer filling the first trench on the first epitaxial layer, wherein a boron concentration of the second epitaxial layer is greater than a boron concentration of the first epitaxial layer.

The embodiments may be realized by providing a semiconductor device including a substrate that includes a first region and a second region; a first fin and a second fin protruding on the substrate and respectively formed on the first region and the second region, wherein the first fin and the second fin respectively extend in a first direction and a second direction; a first gate electrode on the first fin and intersecting the first fin; a second gate electrode on the second fin and intersecting the second fin; a first trench within the first fin at a side of the first gate electrode; a second trench within the second fin at a side of the second gate electrode; a first epitaxial layer partially filling a portion of the first trench; a second epitaxial layer partially filling the first trench on the first epitaxial layer; a third epitaxial layer filling the second trench; and an insulating region between a bottom surface of the second trench and the third epitaxial layer.

The embodiments may be realized by providing a semiconductor device including a substrate; a first fin on the substrate, the first fin extending in a first direction; a first gate electrode on the first fin, the first gate electrode intersecting the first fin; a first trench in the first fin, the first trench being at a side of the first gate electrode; a first epitaxial layer in a bottom portion of the first trench; and a second epitaxial layer on the first epitaxial layer, the second epitaxial layer filling remaining portions of the first trench, wherein a boron concentration of the second epitaxial layer is discontinuous with a boron concentration of the first epitaxial layer at an interface between the first epitaxial layer and the second epitaxial layer.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a semiconductor device according to some exemplary embodiments will be described with reference to FIGS. 1 to 5.

Figure 1:
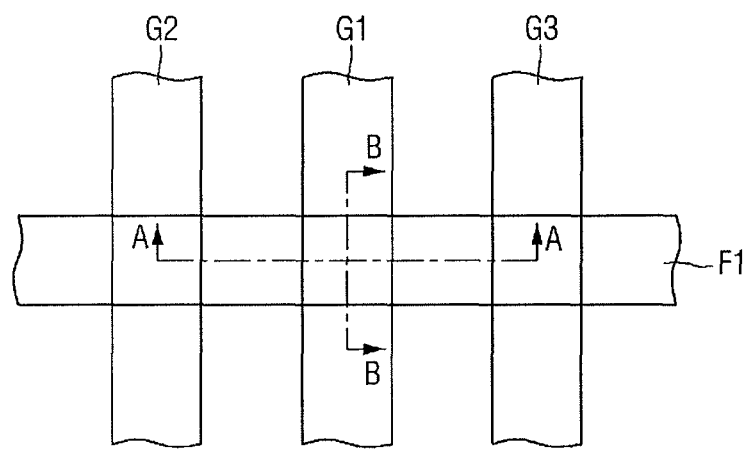
FIG. 1 illustrates a layout view of a semiconductor device according to some exemplary embodiments.
Figure 1:
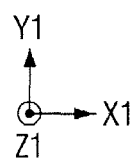
Figure 2:
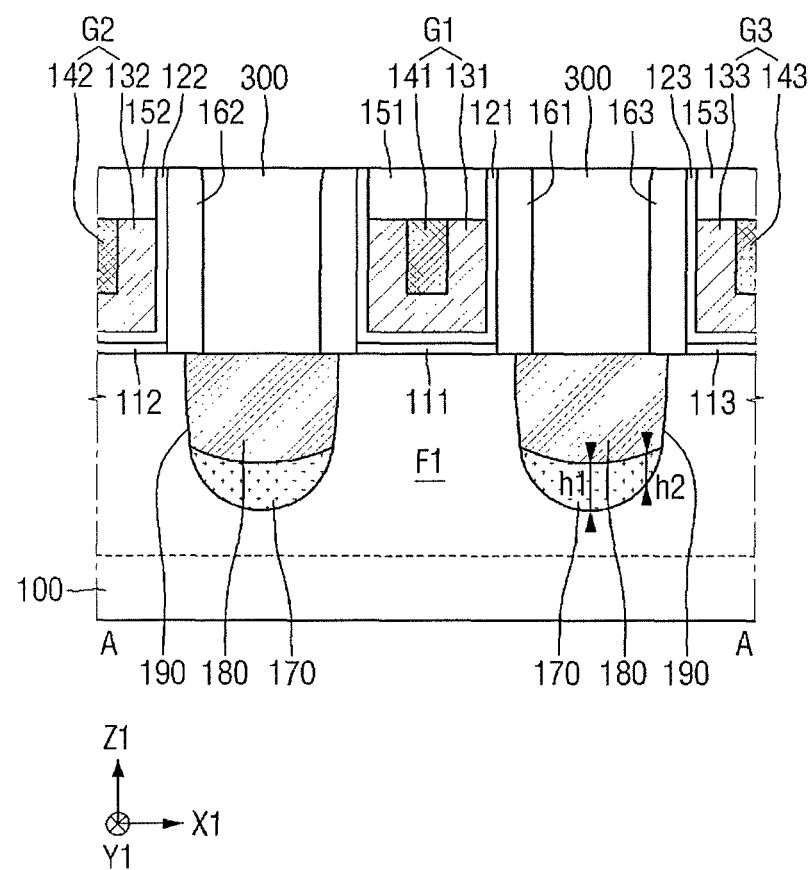
FIG. 2 illustrates a cross sectional view taken along line A-A of FIG. 1.
Figure 3:
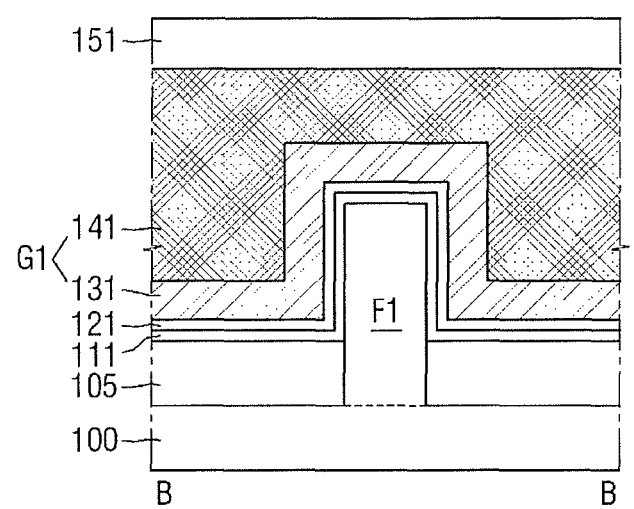
FIG. 3 illustrates a cross sectional view taken along line B-B of FIG. 1.
Figure 3:
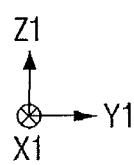
Figure 4:
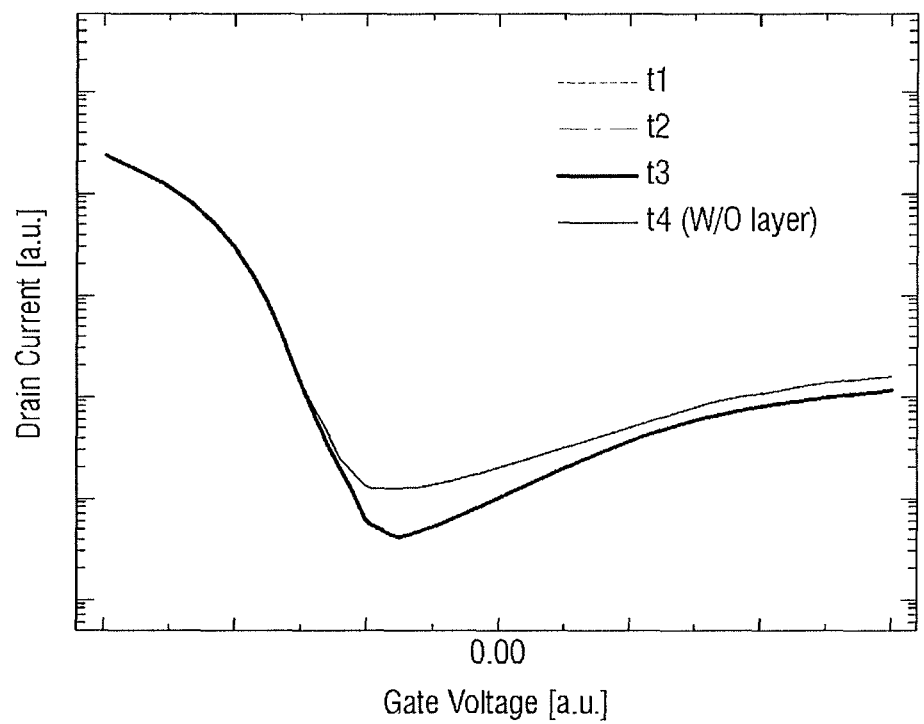
FIG. 4 illustrates a simulation graphical representation provided to show off current characteristics of a semiconductor device according to some exemplary embodiments.
Figure 5:
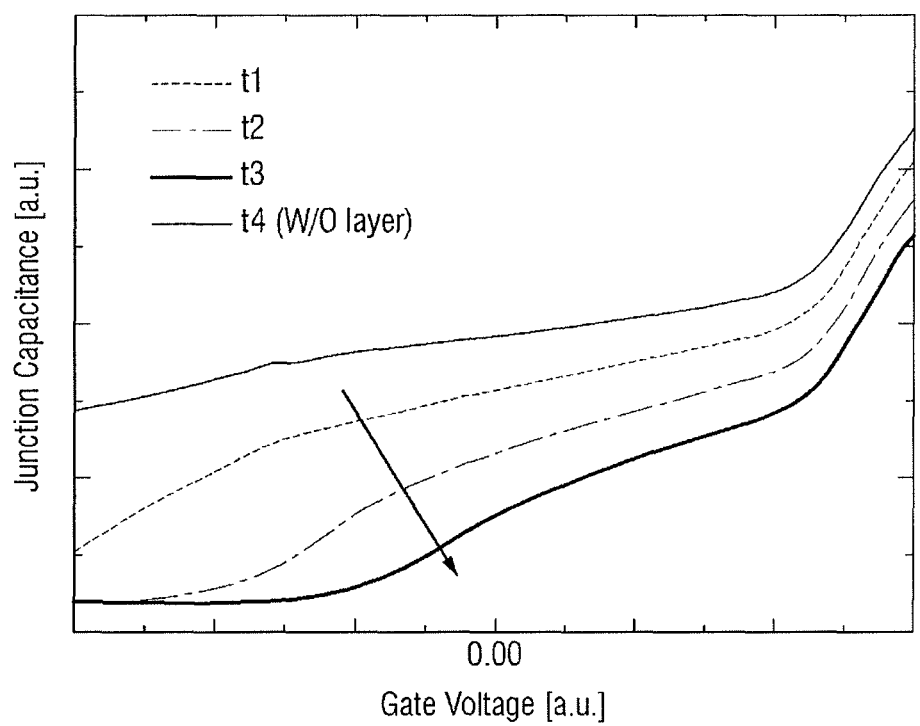
FIG. 5 illustrates a simulation graphical representation provided to show junction capacitance characteristics of a semiconductor device according to some exemplary embodiments.

FIG. 1 illustrates a layout view of a semiconductor device according to some exemplary embodiments, and FIG. 2 illustrates a cross sectional view taken along line A-A of FIG. 1. FIG. 3 illustrates a cross sectional view taken along line B-B of FIG. 1, and FIG. 4 illustrates a simulation graphical representation showing off current characteristics of a semiconductor device according to some exemplary embodiments. FIG. 5 illustrates a simulation graphical representation showing junction capacitance characteristics of a semiconductor device according to some exemplary embodiments.

Referring to FIGS. 1 to 3, the semiconductor device according to some exemplary embodiments may include a substrate 100, a first fin F1, first to third gate electrodes G1-G3, a first trench 190, a first epitaxial layer 170, a second epitaxial layer 180, and an interlayer insulating film 300.

In an implementation, the substrate 100 may be formed of one or more semiconductor materials, e.g., Si, Ge, SiGe, GaP, GaAs, SiC, SiGeC, InAs, or InP. In an implementation, a silicon on insulator (SOI) substrate may be used. For convenience of explanation, the following will describe that the substrate 100 includes Si.

The first fin F1 may be a part of the substrate 100, and may include an epitaxial layer grown from the substrate 100. For example, the first fin F1 may include Si or SiGe. The first fin F1 may protrude from the substrate 100 in a third direction Z1. Accordingly, a height of an upper surface may be a reference with which the substrate 100 and the first fin F1 are identified.

The first fin F1 may extend in a first direction X1. For example, the first fin F1 may have a long side in the first direction X1 and a short side in a second direction Y1. In an implementation, the long side and the short side may be expressions indicating relative lengths. For example, in a layout of a rectangle, the long side may indicate a side illustrated longer than the short side. For example, the first fin F1 may extend lengthwise in the first direction X1 which is a long side direction.

The first fin F1 may include a same material as the substrate 100. In an implementation, the first fin F1 may include Si.

A field insulating film 105 may be formed on the substrate 100, may partially cover a sidewall of the first fin F1, and may expose an upper portion of the first fin F1. For example, the upper surface of the substrate 100 may be covered by the field insulating film 105, except for a portion where the first fin F1 is protruded. In an implementation, the field insulating film 105 may be, e.g., an oxide film.

The first to third gate electrodes G1-G3 may extend lengthwise in the second direction Y1. The first to third gate electrodes G1-G3 may be formed on the first fin F1. For example, the first to third gate electrodes G1-G3 may intersect the first fin F1. The first to third gate electrodes G1-G3 may be spaced apart from each other in the first direction X1. For example, the first to third gate electrodes G1-G3 may be disposed so that long sides thereof face each other in the first direction X1. Accordingly, the first to third gate electrodes G1-G3 may extend in parallel in the second direction Y1.

The first gate electrode G1 may be positioned between the second gate electrode G2 and the third gate electrode G3. For example, the first to third gate electrodes G1-G3 may be disposed in an order of the second gate electrode G2, the first gate electrode G1 and the third gate electrode G3 along the first direction X1.

The first to third gate electrodes G1-G3 may be formed along an upper surface of the first fin F1 and along a side surface of the upper surface of the field insulating film 105. The sectional view of FIG. 2 illustrates that the first to third gate electrodes G1-G3 are on the upper surface of the first fin F1.

First to third interfacial layers 111-113 may be formed under the first to third gate electrodes G1-G3. In an implementation, first to third high-k dielectric films 121-123 may be formed on a lower or bottom surface and a side surface of the first to third gate electrodes G1-G3. First to third capping films 151-153 may be formed on the upper or top surfaces of the first to third gate electrodes G1-G3.

The first to third interfacial layers 111-113 may be formed on the upper surface of the first fin F1. The first to third interfacial layers 111-113 may be formed by oxidizing the upper surface and the side surface of the first fin F1 and the upper surface of the substrate 100. In an implementation, the first to third interfacial layers 111-113 may be formed by oxidizing the upper surface and the side surface of the first fin F1 instead of the upper surface of the substrate 100.

The first to third interfacial layers 111-113 may be formed respectively between first to third gate spacers 161-163. The first to third interfacial layers 111-113 may include a silicon oxide film when the first fin F1 includes silicon. Each of the first to third interfacial layers 111-113 may be a membrane provided to adjust interfacial characteristics between the first fin F1 and the first to third gate electrodes G1-G3. In an implementation, the first to third interfacial layers 111-113 may be omitted.

The first to third high-k dielectric films 121-123 may be respectively formed on the first to third interfacial layers 111-113. The first to third high-k dielectric films 121-123 may include a high-k dielectric material having a higher dielectric constant than the silicon oxide film. In an implementation, the high-k dielectric material may include, e.g., hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

When the first to third interfacial layers 111-113 are omitted in the semiconductor device according to some exemplary embodiments, the first to third high-k dielectric films 121-123 may respectively include not only the high-k dielectric material, but also a silicon oxide film, a silicon oxynitride film, or a silicon nitride film.

Each of the first to third high-k dielectric films 121-123 may be formed conformally along an inner side surface of the first to third gate spacers 161-163 to be described below, as well as the upper surfaces of the first to third interfacial layers 111-113. Accordingly, an uppermost portion of the upper surface of the first to third high-k dielectric films 121-123 may have a same height as the upper surface of the first to third gate spacers 161-163.

The first to third gate electrodes G1-G3 may respectively include first to third work function metals 131-133 and first to third fill metals 141-143. For example, the first gate electrode G1 may include the first work function metal 131 and the first fill metal 141, the second gate electrode G2 may include the second work function metal 132 and the second fill metal 142, and the third gate electrode G3 may include the third work function metal 133 and the third fill metal 143.

The first to third work function metals 131-133 may play a role of adjusting a work function, and the first to third fill metals 141-143 may play a role of filling the space formed by the first to third work function metals 131-133. The first to third work function metals 131-133 may include, e.g., an N-type work function metal, a P-type work function metal, or a combination thereof.

The semiconductor device according to some exemplary embodiments may be a P-type MOSFET. In an implementation, the first to third work function metals 131-133 may be a combination of the N-type work function metal and the P-type work function metal. In an implementation, the first to third work function metals 131-133 may include, e.g., TiN, WN, TiAl, TiAlN, TaN, TiC, TaC, TaCN, TaSiN, or a combination thereof.

In an implementation, the first to third fill metals 141-143 may include, e.g., W, Al, Cu, Co, Ti, Ta, poly-Si, SiGe, or a metal alloy.

The first to third capping films 151-153 may be formed on the first to third high-k dielectric films 121-123 and the first to third gate electrodes G1-G3. The first to third capping films 151-153 may include, e.g., SiN. The first to third capping films 151-153 may be in contact with inner walls of the first to third gate spacers 161-163. In an implementation, the upper surfaces of the first to third capping films 151-153 may be on a same level as the upper surfaces of the first to third gate spacers 161-163. In an implementation, the upper surfaces of the first to third capping films 151-153 may be higher than the upper surfaces of the first to third gate spacers 161-163.

The first to third gate spacers 161-163 may be disposed on the sidewalls of the first to third gate electrodes G1-G3 respectively extending in the second direction Y1. For example, the first to third gate spacers 161-163 may be respectively disposed on the sidewall of a stack structure of the first to third interfacial layers 111-113, the first to third high-k dielectric films 121-123, the first to third gate electrodes G1-G3, and the first to third capping films 151-153.

In an implementation, the first to third spacers 161-163 may include, e.g., silicon nitride (SiN), silicon oxynitride (SiON), silicon oxide (SiO$_2$), silicon oxycarbonitride (SiOCN), or a combination thereof.

In an implementation, as exemplified in the drawings, the first to third gate spacers 161-163 may include a single film, or may be a multi-spacer in which a plurality of films are stacked. Shapes of the first to third gate spacers 161-163 and shapes of the multi-spacers forming the first to third gate spacers 161-163 may each be I- or L-shape, or a combination thereof depending on fabrication or purpose of utilization.

The first trench 190 may be formed between the first to third gate electrodes G1-G3. The first trench 190 may be formed within the first fin F1. For example, the first trench 190 may be formed between the first gate electrode G1 and the second gate electrode G2 and between the first gate electrode G1 and the third gate electrode G3.

The first trench 190 may be in contact with the lower surfaces of the first to third gate spacers 161-163. This may be attributable to the etch process of the first trench 190 including a process of widening a side.

A bottom surface of the first trench 190 may be a downward convex shape. In an implementation, the first trench 190 may have a greater depth farther away from the sidewall of the first trench 190, e.g., toward a center of the first trench 190.

In an implementation, as illustrated in FIG. 2, a depth of the first trench 190 may be lower than a height of the first fin F1. In an implementation, the depth of the first trench 190 may be greater than a height of the first fin F1.

The first epitaxial layer 170 may be formed on a lower portion of the first trench 190. For example, first epitaxial layer 170 may fill only a portion of the first trench 190. The first epitaxial layer 170 may be directly in contact with the bottom surface of the first trench 190, and may be directly in contact with a portion of the side surface of the first trench 190.

The upper surface of the first epitaxial layer 170 may be a downward (e.g., inward) convex shape. This may be attributable to the formation of the first epitaxial layer 170 with the epitaxial growth, from the bottom surface of the first trench 190 which is convex downward.

The first epitaxial layer 170 may have a thicker thickness farther away from the side surface of the first trench 190. For example, a thickness h1 at a center (which is far from the side surfaces, e.g., both side surfaces, of the first trench 190 of the first epitaxial layer 170 may be greater than a thickness h2 which is near to the side surfaces, e.g., both side surfaces, of the first trench 190.

The second epitaxial layer 180 may be formed on the first epitaxial layer 170. The second epitaxial layer 180 may entirely fill the first trench 190 (e.g., remaining portions of the trench not filled by the first epitaxial layer 170). Accordingly, the side surface of the second epitaxial layer 180 may directly contact the rest of the sidewall of the first trench 190. For example, the side surface of the first trench 190 may be in contact with the first epitaxial layer 170 and the second epitaxial layer 180.

Both of the first and second epitaxial layers 170, 180 may include silicon germanium (SiGe). In an implementation, a germanium ratio of silicon germanium may be different in the first epitaxial layer 170 and the second epitaxial layer 180. In an implementation, the ratio of germanium relative to silicon of the first epitaxial layer 170 may be lower than a germanium to silicon ratio of the second epitaxial layer 180. In an implementation, the germanium concentration of the first epitaxial layer 170 may be lower than a germanium concentration of the second epitaxial layer 180.

This may be attributable to characteristic of the epitaxial growth. For example, the Si-containing first fin F1 would hinder formation of a silicon germanium layer having a high germanium concentration with the epitaxial growth, a silicon germanium layer having a lower germanium concentration may be first formed, and a layer having a high germanium concentration may be sequentially epitaxially grown.

In an implementation, a boron (B) concentration of the second epitaxial layer 180 may be higher than a B concentration of the first epitaxial layer 170. The first epitaxial layer 170 may be practically epitaxially grown without adding boron. In an implementation, the second epitaxial layer 180 may be formed with the epitaxial growth with boron added.

The boron concentration may be discontinuously varied on a border of the first epitaxial layer 170 and the second epitaxial layer 180. This may be attributable to the first epitaxial layer 170 and the second epitaxial layer 180 being formed with the processes that use separate epitaxial growths from each other.

In principle, when boron is included, the silicon germanium layer used in a source/drain of a transistor may help increase mobility of a hole by receiving compressive stress because of difference in particle lattice. However, as a side effect of the above, off current characteristic in a device in off state may be degraded and junction capacitance between the source/drain and a fin region may increase. Accordingly, a depth of the source/drain may be kept below a certain level in order to reduce the side effect mentioned above.

The semiconductor device according to some exemplary embodiments may help reduce the off current, and accordingly, reduce junction capacitance by including the first epitaxial layer 170 (that is undoped with boron), at a lower portion of the second epitaxial layer 180 (playing a role of the source/drain).

In FIG. 4, a horizontal axis is gate voltage, and a vertical axis is drain current. FIG. 4 is a graphical representation of simulating drain current without considering material stress. t1, t2, and t3 indicate the semiconductor device including the first epitaxial layer 170 of a thickness which gradually increases, and t4 indicates the semiconductor device excluding the first epitaxial layer 170.

Referring to FIG. 4, an amount of off current may be confirmed when a gate voltage is negative. For example, off current of t4 in the semiconductor device in which the first epitaxial layer 170 is excluded, may be confirmed to be greater than that of t1, t2, and t3 in the semiconductor device in which the first epitaxial layer 170 is included.

As FIG. 4 is a simulation graphical representation which does not consider stress effects, on current of t1 to t4 are appeared uniform (drain current with a gate voltage of at least 0), but on current of t1 to t3 may appear greater when stress effect is considered.

In FIG. 5, a horizontal axis is gate voltage, and a vertical axis is junction capacitance. Likewise FIG. 4, FIG. 5 shows t1, t2, and t3 representing the semiconductor device including the first epitaxial layer 170 of a gradually-increasing thickness, and t4 representing the semiconductor device excluding the first epitaxial layer 170.

Referring to FIG. 5, it may be seen that, as a thickness of the first epitaxial layer 170 may gradually increase, junction capacitance may decrease.

Accordingly, the first epitaxial layer 170 may help further increase a total depth of the source/drain (i.e., depths of the first epitaxial layer 170 and the second epitaxial layer 180). For example, a depth could be limited due to off current and junction capacitance. Such a limit may be avoided with the inclusion of the first epitaxial layer 170, and a total depth of the source/drain may further increase. Accordingly, mobility of the hole may be further increased because compressive stress is further applied.

The interlayer insulating film 300 may be formed on the upper surface of the first epitaxial layer 170. The interlayer insulating film 300 may be formed between the first to third gate electrodes G1-G3, e.g., between the first to third gate spacers 161-163.

For example, the interlayer insulating film 300 may include at least one of silicon oxide, silicon nitride, silicon oxynitride, or a low-k dielectric material with a smaller dielectric constant than silicon oxide. In an implementation, the low-k dielectric material may include, e.g., flowable oxide (FOX), Tonen Silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof.

The semiconductor device according to some exemplary embodiments may help secure a greater depth margin of the source/drain due to the inclusion of the first epitaxial layer 170, and accordingly, stress characteristic of the source/drain may be further increased. Mobility of a carrier of the source/drain may be further heightened, and operating characteristics of the semiconductor device may be much enhanced.

Hereinbelow, the semiconductor device according to some exemplary embodiments will be described with reference to FIG. 6. In the following description, repeated descriptions overlapping with the exemplary embodiments already provided above may not be described or described as brief as possible for the sake of brevity.

Figure 6:
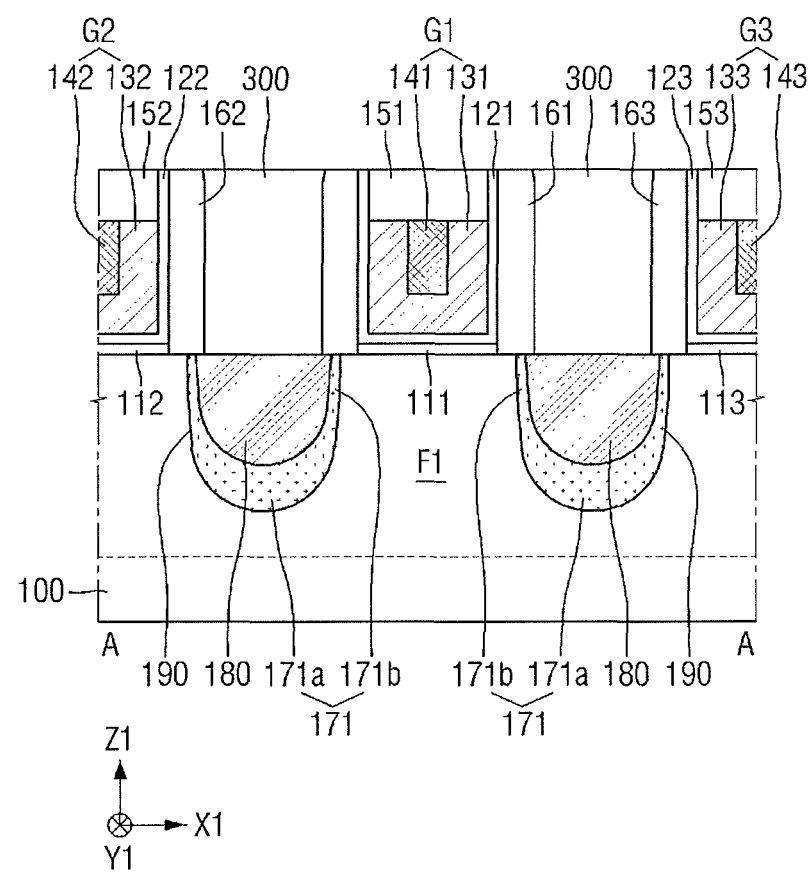
FIG. 6 illustrates a cross sectional view of a semiconductor device according to some exemplary embodiments.

FIG. 6 illustrates a cross sectional view of a semiconductor device according to some exemplary embodiments.

Referring to FIG. 6, the semiconductor device according to some exemplary embodiments may include the first epitaxial layer 171.

The first epitaxial layer 171 may be formed along the bottom surface and along the side surface of the first trench 190. The first epitaxial layer 171 may not be formed conformally along the bottom surface and the side surface of the first trench 190. For example, a thickness of the first epitaxial layer 171 may not be regular.

In an implementation, the first epitaxial layer 171 may include a first portion 171a (on the bottom surface of the first trench 190) and a second portion 171b (on the side surface of the first trench 190). In an implementation, the first portion 171a may be connected to the second portion 171b. The second portion 171b may be formed on sidewalls, e.g., both sidewalls, of the first trench 190, and the two second portions 171b may be connected on the both sides with reference to the first portion 171a.

A thickness of the first portion 171a may be thicker than a thickness of the second portion 171b. In an implementation, a thickness of each of the first portion 171a and the second portion 171b also may not be regular. In an implementation, the second portion 171b may have a thinner thickness farther away from the bottom surface. A thickness of the first portion 171a may become thinner nearer to the side surface from the bottom surface.

Such distribution of a thickness may be attributable to a shape of the bottom surface of the first trench 190 and characteristics of the epitaxial growth. For example, the above distribution may be attributable to difference in a rate of the epitaxial growth in the third direction Z1 from the bottom surface and a rate of the epitaxial growth in the first direction X1 from the side surface.

In an implementation, an uppermost portion of the upper surface of the first epitaxial layer 171 may be respectively in contact with the lower surfaces of the first to third gate spacers 161-163. The above may be attributable to the contact of the first trench 190 to the lower surfaces of the first and third gate spacers 161-163.

The second epitaxial layer 180 may be formed on the first epitaxial layer 171. The second epitaxial layer 180 may not directly contact the side surface and the bottom surface of the first trench 190. For example, the second epitaxial layer 180 may be directly in contact with the upper surface of the first epitaxial layer 171, and may be separated from the side surface and the bottom surface of the first trench 190. For example, the lower surface of the second epitaxial layer 180 may be in contact with only the upper surface of the first epitaxial layer 171.

A germanium concentration of the first epitaxial layer 171 may be lower than that of the second epitaxial layer 180. According to an order of the processes, the first epitaxial layer 171 may be formed before the second epitaxial layer 180 is formed, and the second epitaxial layer 180 may be formed on the first epitaxial layer 171 with the epitaxial growth. In an implementation, as the first epitaxial layer 171 is formed on the side surface, forming the second epitaxial layer 180 may be easier.

The semiconductor device according to some exemplary embodiments in FIG. 6 may have a structure formed as the epitaxial growth is performed on both the side surface and the bottom surface of the first trench 190. Accordingly, junction capacitance between the first trench 190 and the first fin F1 may be improved also on the side surface.

Hereinbelow, the semiconductor device according to some exemplary embodiments will be described with reference to FIG. 7. In the following description, repeated descriptions overlapping with the exemplary embodiments already provided above may not be described or described as brief as possible for the sake of brevity.

Figure 7:
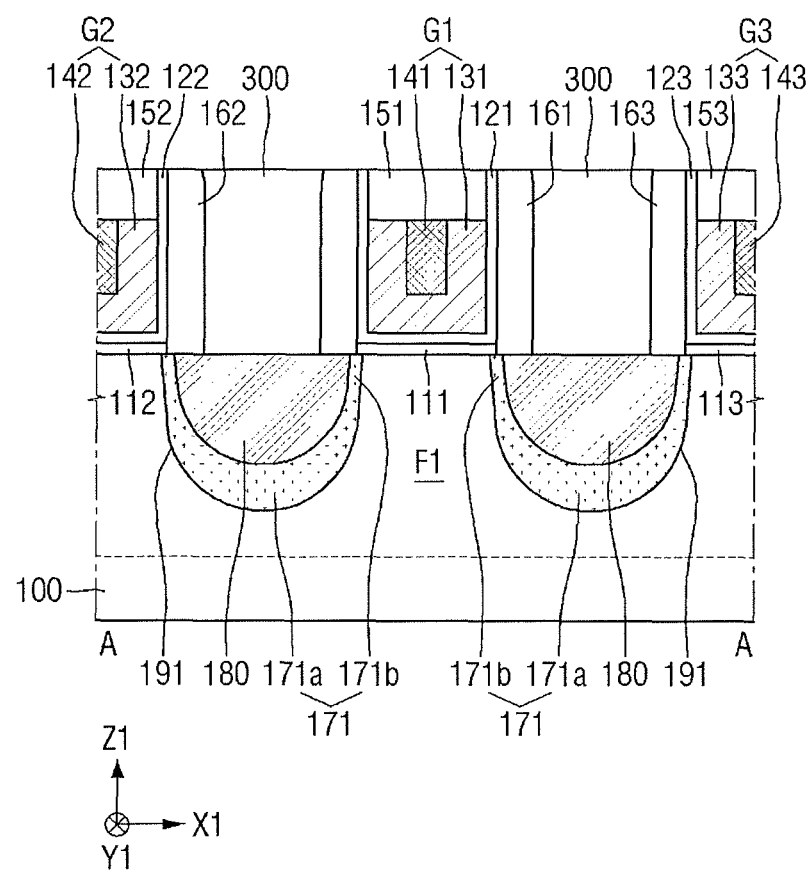
FIG. 7 illustrates a cross sectional view of a semiconductor device according to some exemplary embodiments.

FIG. 7 illustrates a cross sectional view of a semiconductor device according to some exemplary embodiments.

Referring to FIG. 7, the first trench 191 may be in contact with the first to third interfacial layers 111-113 on the lower portion of the first to third gate electrodes G1-G3 as well as the first to third gate spacers 161-163.

Generally, as the first to third gate spacers 161-163 are formed and the first trench 191 is formed, the upper surface of the first fin F1 supporting the first to third gate spacers 161-163 on the lower portion of the first to third gate spacers 161-163 may slightly remain under the first to third gate spacers 161-163. However, the first to third gate spacers 161-163 may be partially etched in an inner sidewall with a gate last fabrication in a subsequent process and, as a final result, the first to third gate spacers 161-163 may appear to be supported by the first epitaxial layer 171 and the second epitaxial layer 180 rather than the upper surface of the first fin F1. For example, as illustrated in FIG. 7, a portion of the first epitaxial layer 171 in the first trench 191 may contact the first gate electrode G1 (e.g., the first interfacial layer 111 of the first gate electrode G1).

Further, the first to third interfacial layers 111-113 and the first to third high-k dielectric films 121-123 may be present and a germanium concentration of the first epitaxial layer 171 may be relatively low, and the second epitaxial layer 180 and the first to third gate electrodes G1-G3 may be kept in an electrically insulated state from each other.

For example, the semiconductor device according to some exemplary embodiments, as illustrated in FIG. 7, may help greatly improve yield and operating characteristics of the semiconductor device because the source/drain region is formed slightly larger, which in turn may help increase stress characteristics of the first epitaxial layer 170, and ensure a large process margin.

Hereinbelow, the semiconductor device according to some exemplary embodiments will be described with reference to FIG. 8. In the following description, repeated descriptions overlapping with the exemplary embodiments already provided above may not be described or described as brief as possible for the sake of brevity.

Figure 8:
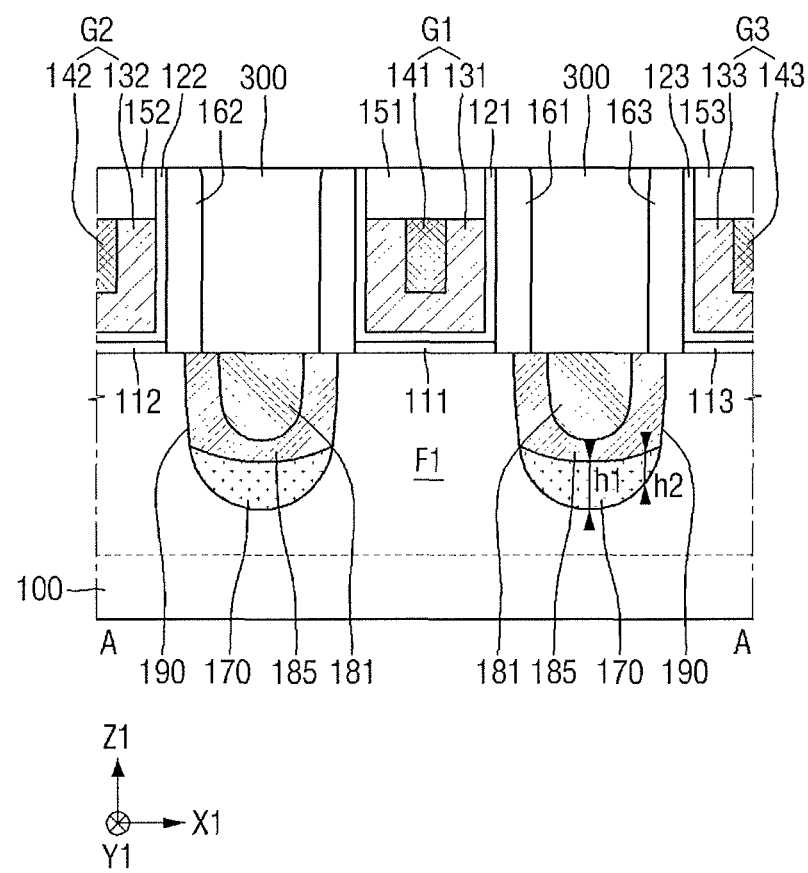
FIG. 8 illustrates a cross sectional view of a semiconductor device according to some exemplary embodiments.

FIG. 8 illustrates a cross sectional view of a semiconductor device according to some exemplary embodiments.

Referring to FIG. 8, the semiconductor device according to some exemplary embodiments may include a third epitaxial layer 185 and the second epitaxial layer 181 on the first epitaxial layer 170.

The third epitaxial layer 185 may be formed on the first epitaxial layer 170. The third epitaxial layer 185 may be formed along the upper surface of the first epitaxial layer 170 and the side surface of the first trench 190. For example, the third epitaxial layer 185 may not be formed conformally along the upper surface of the first epitaxial layer 170 and the side surface of the first trench 190. For example, a thickness of the third epitaxial layer 185 may not be regular.

The second epitaxial layer 181 may fill the portion of the first trench 190 which is not filled even with the third epitaxial layer 185. The second epitaxial layer 181 may be formed on the third epitaxial layer 185 and separated from the sidewall of the first trench 190.

The third epitaxial layer 185 and the second epitaxial layer 181 may both include silicon germanium. In an implementation, a germanium to silicon ratio of silicon germanium of the third epitaxial layer 185 may be smaller than a germanium to silicon ratio of silicon germanium of the second epitaxial layer 181. For example, a germanium concentration of the third epitaxial layer 185 may be smaller than a germanium concentration of the second epitaxial layer 181.

Such structure of the semiconductor device according to some exemplary embodiments in FIG. 8 may be attributable to the epitaxial growth characteristic. For example, it may be difficult to grow silicon germanium having a high germanium concentration directly on the first fin F1 having a silicon material. Accordingly, a silicon germanium layer may be formed in the order of a lower germanium concentration. Accordingly, the third epitaxial layer 185 may be formed first, and the second epitaxial layer 181 may then be formed thereon with the epitaxial growth.

As a result, the second epitaxial layer 180 having a high germanium concentration may be easily formed, and as a result, the semiconductor device according to some exemplary embodiments may maximize stress characteristics.

Hereinbelow, the semiconductor device according to some exemplary embodiments will be described with reference to FIG. 9. In the following description, repeated descriptions overlapping with the exemplary embodiments already provided above may not be described or described as brief as possible for the sake of brevity.

Figure 9:
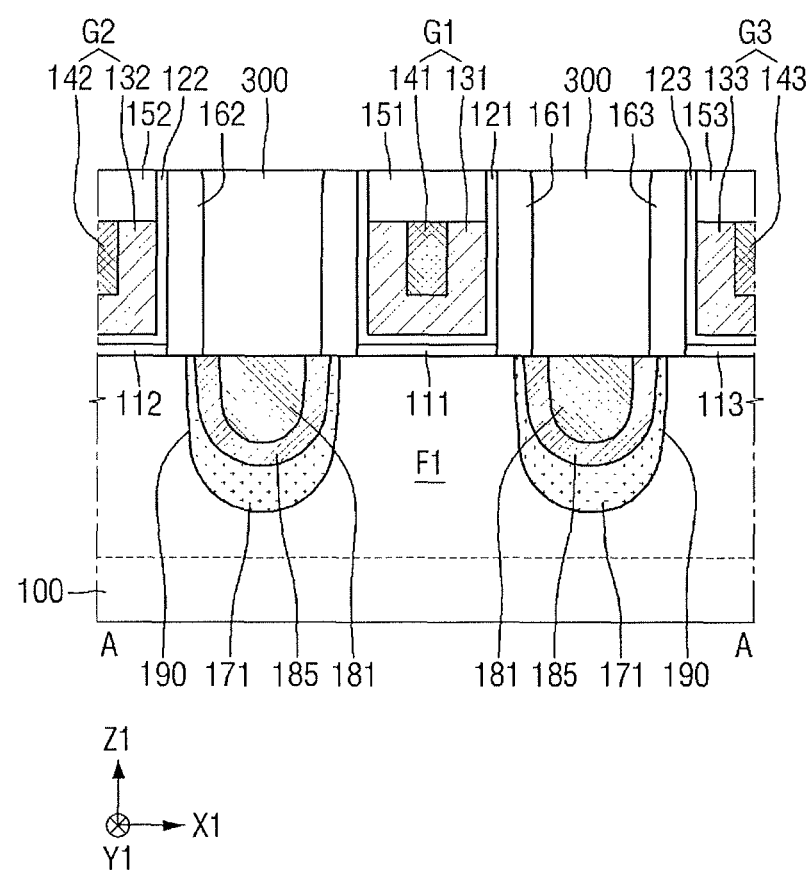
FIG. 9 illustrates a cross sectional view of a semiconductor device according to some exemplary embodiments.

FIG. 9 illustrates a cross sectional view of a semiconductor device according to some exemplary embodiments.

Referring to FIG. 9, the semiconductor device according to some exemplary embodiments may sequentially include the third epitaxial layer 185 and the second epitaxial layer 181 on the first epitaxial layer 171.

The first epitaxial layer 171 may have a same structure as the first epitaxial layer 171 described in FIG. 6. The third epitaxial layer 185 may be separated from the side surface of the first trench 190 and formed on the first epitaxial layer 171. The third epitaxial layer 185 may have a germanium concentration that is higher than that of the first epitaxial layer 171. Accordingly, the process of forming the third epitaxial layer 185 may be facilitated.

For example, a germanium concentration may increase in stages in an order of the first epitaxial layer 171, the third epitaxial layer 185, and the second epitaxial layer 181. In view of fabrication process, in order to form a silicon germanium layer having a gradually increasing germanium concentration, the first epitaxial layer 171, the third epitaxial layer 185, and the second epitaxial layer 181 may be sequentially formed on the bottom surface and the side surface of the first trench 190. As a result, the semiconductor device according to some exemplary embodiments may maximize stress characteristics.

Hereinbelow, the semiconductor device according to some exemplary embodiments will be described with reference to FIGS. 10 to 12. In the following description, repeated descriptions overlapping with the exemplary embodiments already provided above may not be described or described as brief as possible for the sake of brevity.

Figure 10:
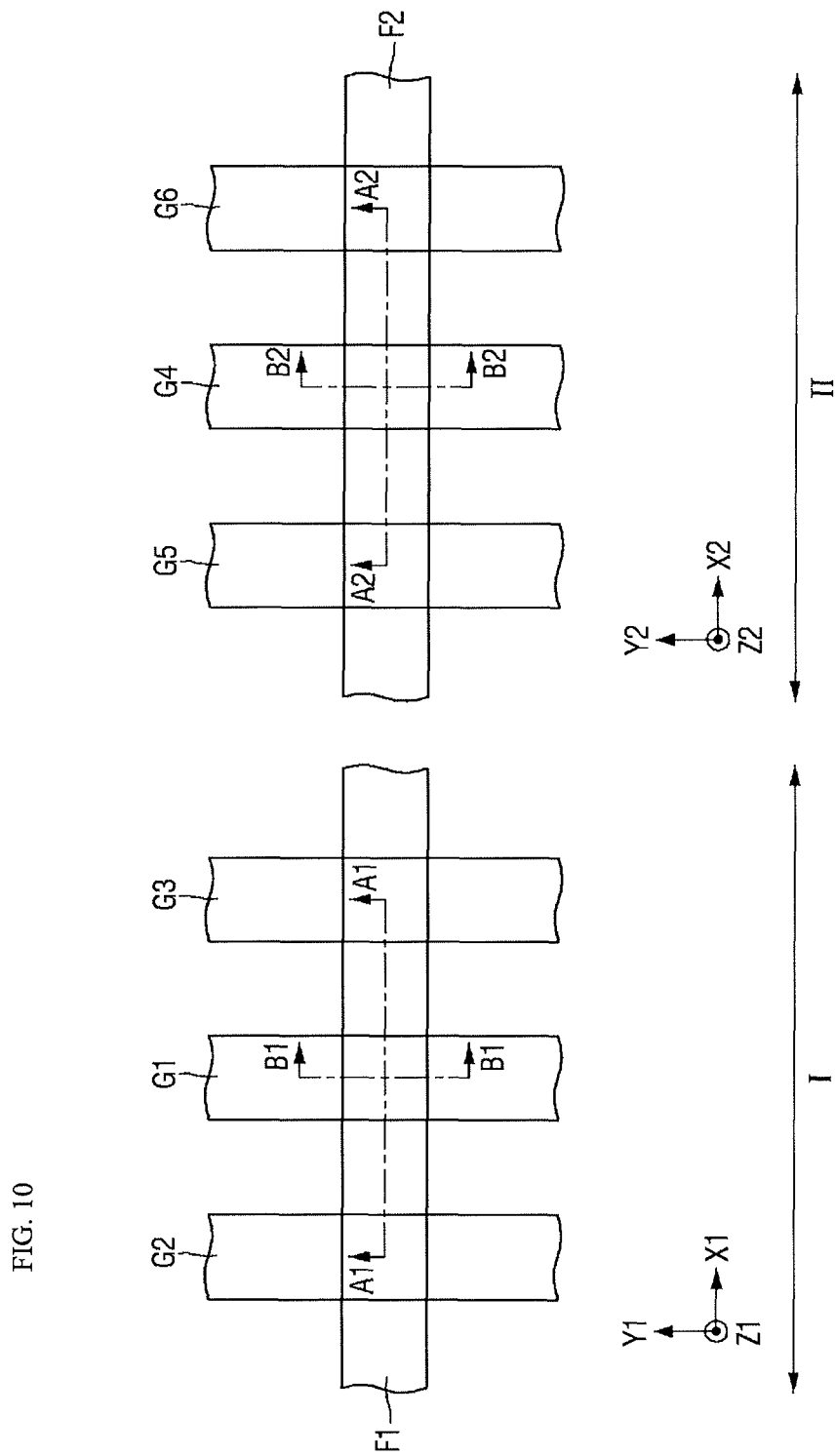
FIG. 10 illustrates a layout view of a semiconductor device according to some exemplary embodiments.
Figure 11:
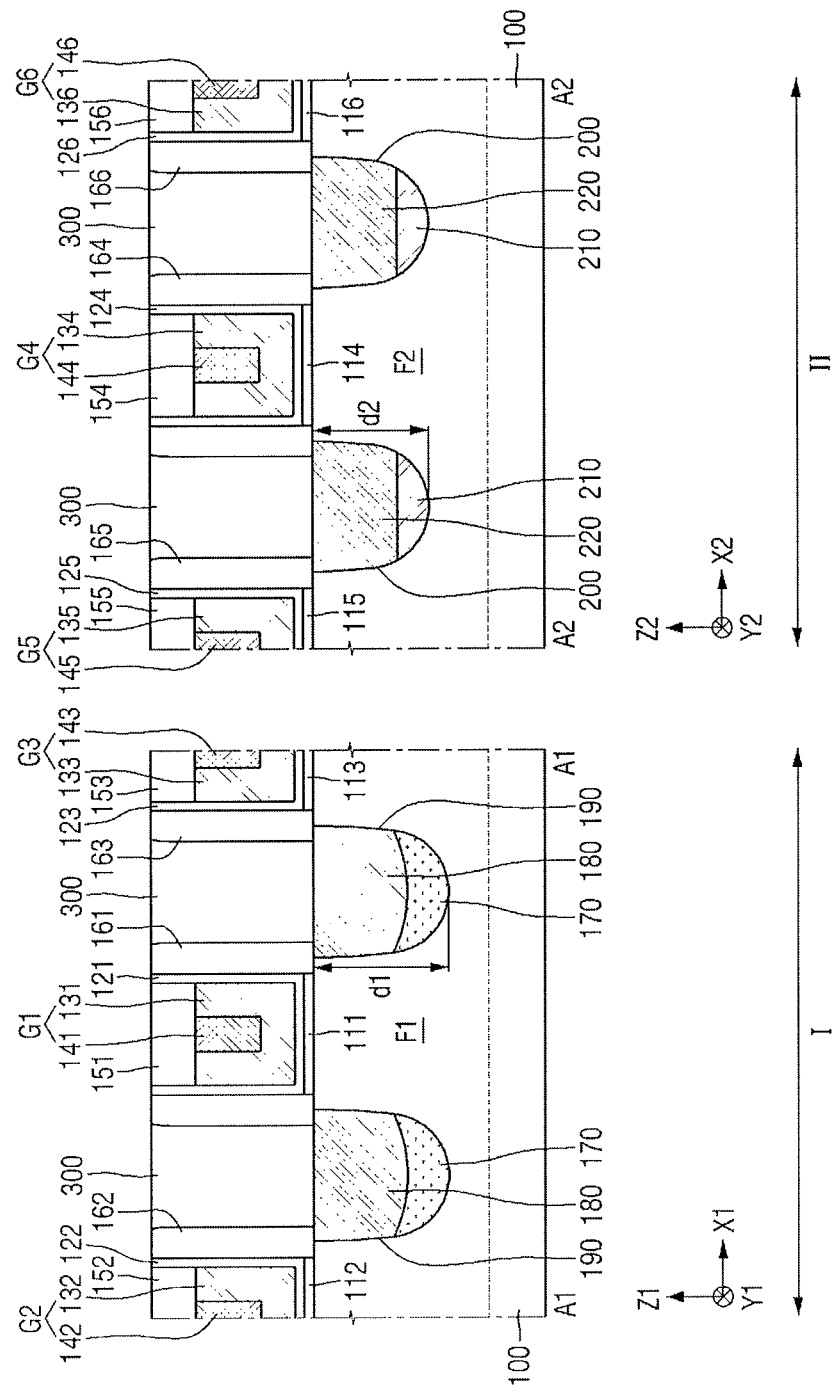
FIG. 11 illustrates a cross sectional view taken along lines A1-A1 and A2-A2 of FIG. 10.

FIG. 10 illustrates a layout view of a semiconductor device according to some exemplary embodiments, and FIG. 11 illustrates a cross sectional view of a portion taken along lines A1-A1 and A2-A2 of FIG. 10. FIG. 12 illustrates a cross sectional view taken along lines B1-B1 and B2-B2 of FIG. 10.

Figure 12:
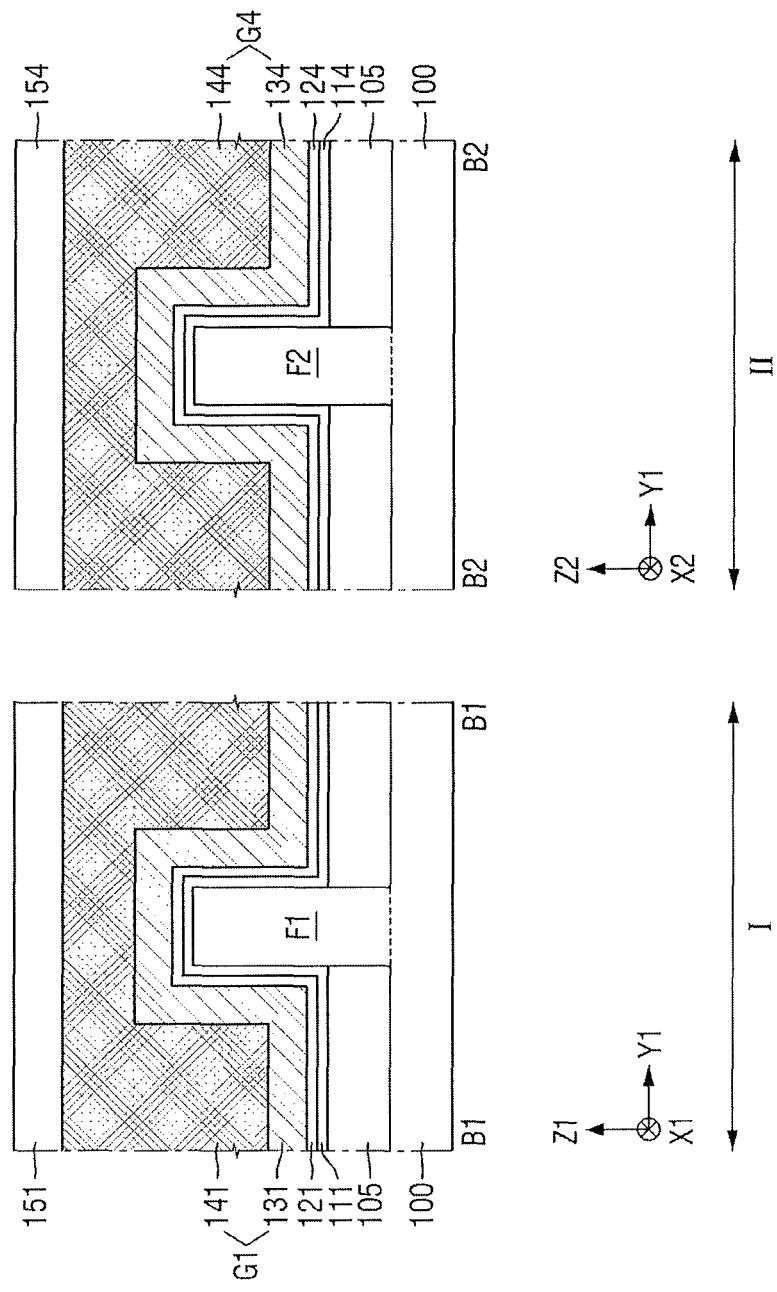
FIG. 12 illustrates a cross sectional view taken along lines B1-B1 and B2-B2 of FIG. 10.

Referring to FIGS. 10 to 12, the substrate 100 of the semiconductor device according to some exemplary embodiments may include a first region I and a second region II.

The first region I and the second region II may be adjacent to each other or may be spaced apart from each other. The first region I and the second region II may be respectively defined based on the first to third directions X1, Y1, Z1 and fourth to sixth directions X2, Y2, Z2. In an implementation, the first to third directions X1, Y1, Z1, and the fourth to sixth directions X2, Y2, Z2 may be same directions as each other or different directions from each other.

The first region I and the second region II may be respectively a PMOS region and an NMOS region. For example, the semiconductor device formed in the first region I may be the P-type MOSFET that uses the hole as a carrier, and the semiconductor device formed in the second region II may be the N-type MOSFET that uses an electron as a carrier.

The first region I may be same as that of the semiconductor device described with reference to FIGS. 1 to 5. Hereinbelow, the second region II will be mainly described.

The second fin F2 may be a part of the substrate 100, and may include an epitaxial layer grown from the substrate 100. For example, the second fin F2 may include Si or SiGe. The second fin F2 may protrude from the substrate 100 in the sixth direction Z2. Accordingly, a height of the upper surface may be a reference to identify the substrate 100 and the second fin F2.

The second fin F2 may extend in the fourth direction X2. For example, the second fin F2 may have a long side in the fourth direction X2, and a short side in the fifth direction Y2. In an implementation, the long side and the short side may be expressions representing relative lengths. For example, in a layout of a rectangle, the long side may represent a side illustrated longer than the short side. For example, the second fin F2 may extend in the fourth direction X2 which is a long side direction. The second fin F2 may include a same material as the substrate 100. For example, the second fin F2 may include Si.

The field insulating film 105 may be formed on the substrate 100, while partially covering the sidewall of the second fin F2 and exposing the upper portion of the second fin F2. For example, the upper surface of the substrate 100 may be covered by the field insulating film 105, except for a portion where the second fin F2 is protruded. The field insulating film 105 may be, e.g., an oxide film.

Fourth to sixth gate electrodes G4-G6 may extend in the fifth direction Y2. The fourth to sixth gate electrodes G4-G6 may be formed on the second fin F2. For example, the fourth to sixth gate electrodes G4-G6 may intersect the second fin F2. The fourth to sixth gate electrodes G4-G6 may be spaced apart from each other in the fourth direction X2. For example, the fourth to sixth gate electrodes G4-G6 may be disposed so that the long sides face each other in the fourth direction. Accordingly, the fourth to sixth gate electrodes G4-G6 may extend in parallel in the fourth direction.

The fourth gate electrode G4 may be positioned between the fifth gate electrode G5 and the sixth gate electrode G6. For example, the fourth to sixth gate electrodes G4-G6 may be disposed in the fourth direction X2 according to an order of the fifth gate electrode G5, the fourth gate electrode G4, and the sixth gate electrode G6.

The fourth to sixth gate electrodes G4-G6 may be formed along the upper surface and the side surface of the second fin F2 and the upper surface of the field insulating film 105. A cross sectional view of FIG. 12 illustrates that the fourth to sixth gate electrodes G4-G6 are positioned on the upper surface of the second fin F2.

Fourth to sixth interfacial layers 114-116 may be formed under the fourth to sixth gate electrodes G4-G6. Further, fourth to sixth high-k dielectric films 124-126 may be formed under the lower surface and the side surface of the fourth to sixth gate electrodes G4-G6. The fourth to sixth capping films 154-156 may be formed on the upper surfaces of the fourth to sixth gate electrodes G4-G6.

The fourth to sixth interfacial layers 114-116 may be formed on the upper surface of the second fin F2. The fourth to sixth interfacial layers 114-116 may be formed by oxidizing the upper surface and the side surface of the second fin F2 and the upper surface of the substrate 100. In an implementation, the fourth to sixth interfacial layers 114-116 may be formed by oxidizing the upper surface and the side surface of the second fin F2 instead of the upper surface of the surface 100.

The fourth to sixth interfacial layers 114-116 may be respectively formed between the fourth to sixth gate spacers 164-166. The fourth to sixth interfacial layers 114-116 may include a silicon oxide film when the second fin F2 includes silicon. The fourth to sixth interfacial layers 114-116 may be respective films to adjust interfacial characteristics between the second fin F2 and the fourth to sixth gate electrodes G4-G6. In an implementation, the fourth to sixth interfacial layers 114-116 may be omitted.

The fourth to sixth high-k dielectric films 124-126 may be respectively formed on the fourth to sixth interfacial layers 114-116. The fourth to sixth high-k dielectric films 124-126 may include a high-k dielectric material having a higher dielectric constant than the silicon oxide film. In an implementation, the high-k dielectric material may include, e.g., hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

When the fourth to sixth interfacial layers 114-116 are omitted in the semiconductor device according to some exemplary embodiments, the fourth to sixth high-k dielectric films 124-126 may include not only the high-k dielectric material described above, but also, e.g., silicon oxide film, silicon oxynitride film, or silicon nitride film.

The fourth to sixth high-k dielectric films 124-126 may be respectively formed conformally along the inner side surfaces of fourth to sixth gate spacers 164-166 described below, as well as the upper surfaces of the fourth to sixth interfacial layers 114-116. Accordingly, uppermost portions of the upper surfaces of the fourth to sixth high-k dielectric films 124-126 may have a same height as the upper surfaces of the fourth to sixth gate spacers 164-166.

The fourth to sixth gate electrodes G4-G6 may respectively include fourth to sixth work function metals 134-136 and fourth to sixth fill metals 144-146. For example, the fourth gate electrode G4 may include the fourth work function metal 134 and the fourth fill metal 144, the fifth gate electrode G5 may include the fifth work function metal 135 and the fifth fill metal 145, and the sixth gate electrode G6 may include the sixth work function metal 136 and the sixth fill metal 146.

The fourth to sixth work function metals 134-136 may play a role of adjusting a work function, and the fourth to sixth fill metals 144-146 may play a role of filling the space formed by the fourth to sixth work function metals 134-136. The fourth to sixth work function metals 134-136 may be, e.g., the N-type work function metals.

The semiconductor device according to some exemplary embodiments may be the N-type MOSFET. In an implementation, the fourth to sixth work function metals 134-136 may be the N-type work function metals. In an implementation, the fourth to sixth work function metals 134-136 may include, e.g., TiN, WN, TaN, TiC, TaC, TaCN, TaSiN, or a combination thereof.

In an implementation, the fourth to sixth fill metals 144-146 may include, e.g., W, Al, Cu, Co, Ti, Ta, poly-Si, SiGe, or a metal alloy.

The fourth to sixth capping films 154-156 may be formed on the fourth to sixth high-k dielectric films 124-126 and the fourth to sixth gate electrodes G4-G6. For example, the fourth to sixth capping films 154-156 may include SiN. The fourth to sixth capping films 154-156 may be in contact with the inner walls of the fourth to sixth gate spacers 164-166. In an implementation, the upper surfaces of the fourth to sixth capping films 154-156 may be on a same level as the upper surfaces of the fourth to sixth gate spacers 164-166. The upper surfaces of the fourth to sixth capping films 154-156 may be higher than the upper surfaces of the fourth to sixth gate spacers 164-166.

The fourth to sixth gate spacers 164-166 may be disposed on the sidewalls of the fourth to sixth gate electrodes G4-G6 respectively extending in the fifth direction Y2. For example, the fourth to sixth gate spacers 164-166 may be respectively disposed on the sidewall of the stack structure of the fourth to sixth interfacial layers 114-116, the fourth to sixth high-k dielectric films 124-126, the fourth to sixth gate electrodes G4-G6, and the first to third capping films 151-153.

In an implementation, the fourth to sixth gate spacers 164-166 may include, e.g., silicon nitride (SiN), silicon oxynitride (SiON), silicon oxide ($SiO_2$), silicon oxycarbonitride (SiOCN), or a combination thereof.

As exemplified in the drawings, the fourth to sixth gate spacers 164-166 may include a single film, or may be a multi-spacer in which a plurality of films are stacked. Shapes of the fourth to sixth gate spacers 164-166 and shapes of the multi-spacers forming the fourth to sixth gate spacers 164-166 may each be I- or L-shape, or a combination thereof depending on fabrication or purpose of utilization.

The second trench 200 may be formed between the fourth to sixth gate electrodes G4-G6. The second trench 200 may be formed on the second fin F2. For example, the second trench 200 may be formed between the fourth gate electrode G4 and the fifth gate electrode G5 and between the fourth gate electrode G4 and the sixth gate electrode G6.

The second trench 200 may be in contact with the lower surfaces of the fourth to sixth gate spacers 164-166. This may be attributable to the fact that the etch process of the second trench 200 includes the process of widening a side.

The bottom surface of the second trench 200 may be in a downwardly convex shape. In an implementation, the second trench 200 may have a greater depth farther away from the sidewall of the second trench 200.

A depth d2 of the second trench 200 may be different from a depth d1 of the first trench 190. For example, the depth d2 of the second trench 200 may be less than the depth d1 of the first trench 190. Because the second trench 200 is in the NMOS region, applying tensile stress rather than compressive stress may help increase the mobility of electron as a carrier. Accordingly, a need to ensure a greater depth of silicon germanium may be relatively less compared to the PMOS region. Accordingly, the depth d2 of the second trench 200 may be formed shallower than the depth d1 of the first trench 190. In an implementation, the depth d2 of the second trench 200 may be deeper than the depth d1 of the first trench 190.

The first insulating layer 210 may be formed on the lower portion of the second trench 200. The first insulating layer 210 may fill only a portion of the second trench 200. The first insulating layer 210 may directly contact the bottom surface of the second trench 200 and directly contact a portion of the side surface of the second trench 200.

The first insulating layer 210 may include an insulating material. For example, the first insulating layer 210 may include at least one of silicon oxide and silicon nitride.

The fourth epitaxial layer 220 may be formed on the first insulating film 210. The fourth epitaxial layer 220 may entirely fill the second trench 200 (e.g., remaining portions of the second trench 200). Accordingly, the side surface of the fourth epitaxial layer 220 may directly contact the rest of the sidewall of the second trench 200. For example, the side surface of the second trench 200 may contact the first insulating film 210 and the fourth epitaxial layer 220.

Unlike the first and second epitaxial layers 170, 180, the fourth epitaxial layer 220 may not include germanium. For example, the fourth epitaxial layer 220 may include silicon (Si) or silicon carbide (SiC) added with or further including phosphorus (P). For example, the fourth epitaxial layer 220 may include at least one of SiP and SiCP.

In the semiconductor device according to some exemplary embodiments, the first region I, i.e., the PMOS region may help enhance stress characteristics, off current, and junction capacitance, and although the same method cannot be applied due to different stress characteristic between the regions, the second region II, i.e., the NMOS region may also help enhance off current characteristics with the inclusion of the first insulating layer 210. For example, the semiconductor device enhanced with operating characteristics suitable for characteristic of each region may be provided.

Hereinbelow, the semiconductor device according to some exemplary embodiments will be described with reference to FIG. 13. In the following description, repeated descriptions overlapping with the exemplary embodiments already provided above may not be described or described as brief as possible for the sake of brevity.

Figure 13:
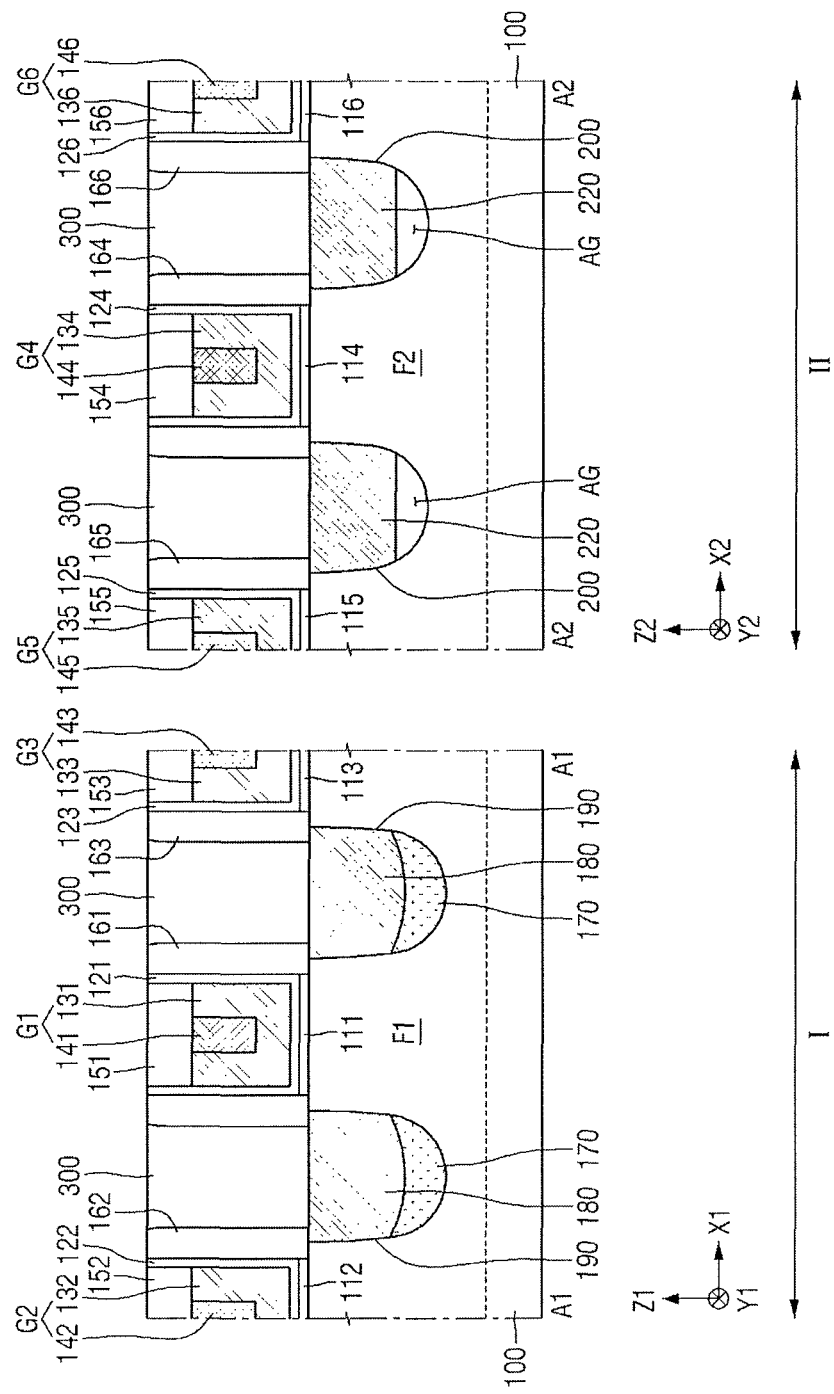
FIG. 13 illustrates a cross sectional view of a semiconductor device according to some exemplary embodiments.

FIG. 13 illustrates a cross sectional view of a semiconductor device according to some exemplary embodiments.

Referring to FIG. 13, the semiconductor device according to some exemplary embodiments may include an air gap AG in the second trench 200 of the second region II.

The air gap AG may be surrounded by a portion of the bottom surface and the side surface of the second trench 200, and the lower surface of the fourth epitaxial layer 220. The air gap AG may be formed so that the bottom surfaces of the fourth epitaxial layer 220 and the second trench 200 are not in contact each other under the fourth epitaxial layer 220.

The air gap AG may serve as insulating region like the first insulating layer 210 of FIG. 11. For example, the air gap AG including air may be dielectric material having a highest dielectric constant, and it may act to efficiently prevent off current from the fourth epitaxial layer 220.

Hereinbelow, a method for fabricating the semiconductor device according to some exemplary embodiments will be explained with reference to FIGS. 2 and 14 to 20. In the following description, repeated descriptions overlapping with the exemplary embodiments already provided above may not be described or described as briefly as possible for the sake of brevity.

FIGS. 14 to 20 illustrate views of stages in a method for fabricating a semiconductor device according to some exemplary embodiments.

Figure 14:
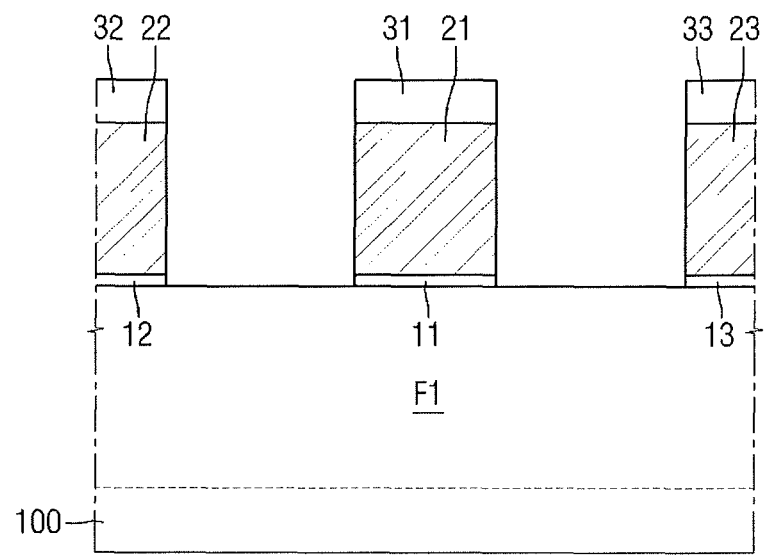
FIGS. 14 to 20 illustrate views showing stages in a method for fabricating a semiconductor device according to some exemplary embodiments.

First, referring to FIG. 14, the first fin F1 may be formed on the substrate 100, and first to third dummy gate electrodes 21-23 may be formed on the first fin F1.

For example, first to third dummy gate insulating films 11-13 may be formed on the upper surface of the first fin F1, the first to third dummy gate electrodes 21-23 may be formed on the first to third dummy gate insulating films 11-13, and first to third dummy capping films 31-33 may be formed on the first to the third dummy gate electrodes 21-23.

In an implementation, the first to third dummy gate insulating films 11-13, the first to third dummy gate electrodes 21-23, and the first to third dummy capping films 31-33 may be respectively formed, or formed as being patterned en bloc in the stack structure.

The first to third dummy gate insulating films 11-13, the first to third dummy gate electrodes 21-23, and the first to third dummy capping films 31-33 may respectively extend in the second direction Y1 and may be spaced apart in the first direction X1. For example, they may extend in parallel in the second direction Y1.

Figure 15:
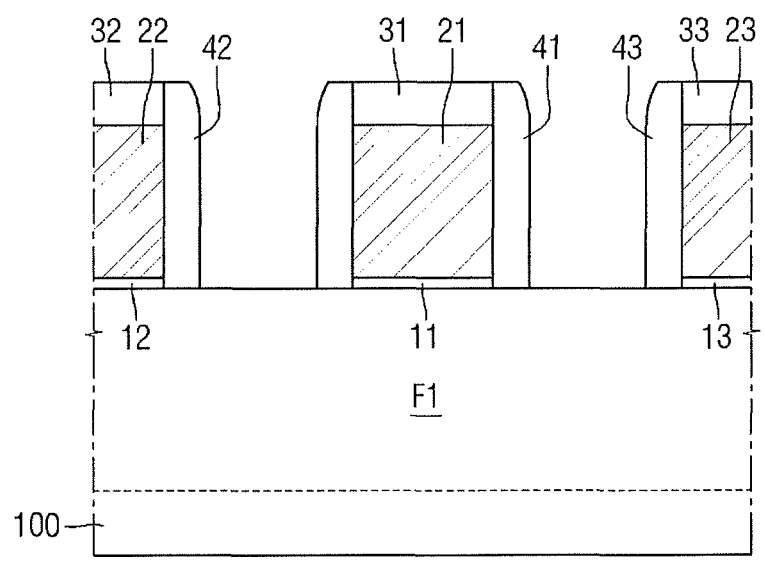
Figure 15:
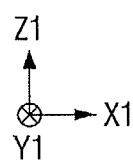

Next, referring to FIG. 15, the first to third dummy gate insulating films 11-13, the first to third dummy gate electrodes 21-23, and the first to third dummy capping films 31-33 may form the first to third dummy gate spacers 41-43 on sides, e.g., both sides, of each stack structure.

The first to third dummy gate spacers 41-43 may become the first to third gate spacers 161-163 after undergoing a plurality of etch processes.

Figure 16:
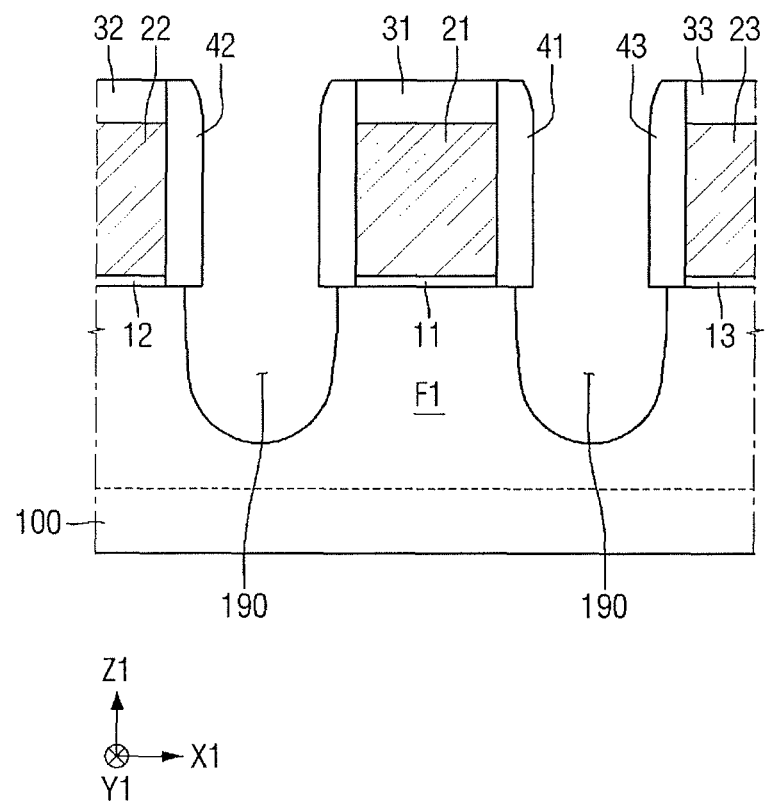

Next, referring to FIG. 16, the first trench 190 may be formed by etching the first fin F1.

In an implementation, the first trench 190 may be formed through a plurality of etch processes. A plurality of etch processes may include a bowl etch process of expanding a width of the first trench 190. With the bowl etch process, the lower surfaces of the first to third dummy gate spacers 41-43 may be partially exposed.

Figure 17:
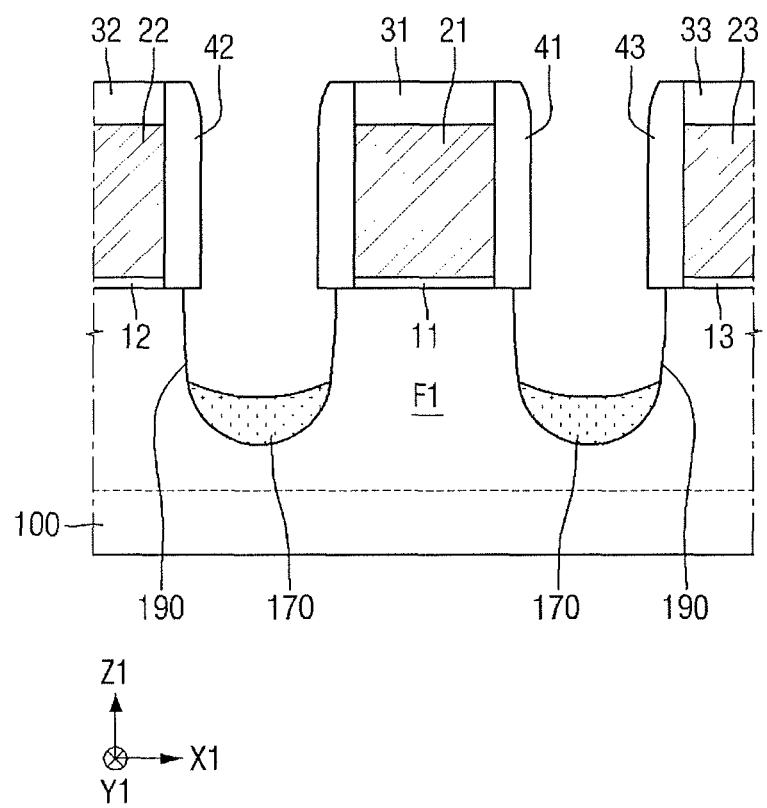

Next, referring to FIG. 17, the lower portion of the first trench 190 may form the first epitaxial layer 170.

In an implementation, the first epitaxial layer 170 may be grown with epitaxial growth. The first epitaxial layer 170 may be epitaxially grown without addition of boron. In an implementation, the first epitaxial layer may be formed with the epitaxial growth on the side surface of the first trench 190 as in the example of the first epitaxial layer 171 of FIG. 6.

Figure 18:
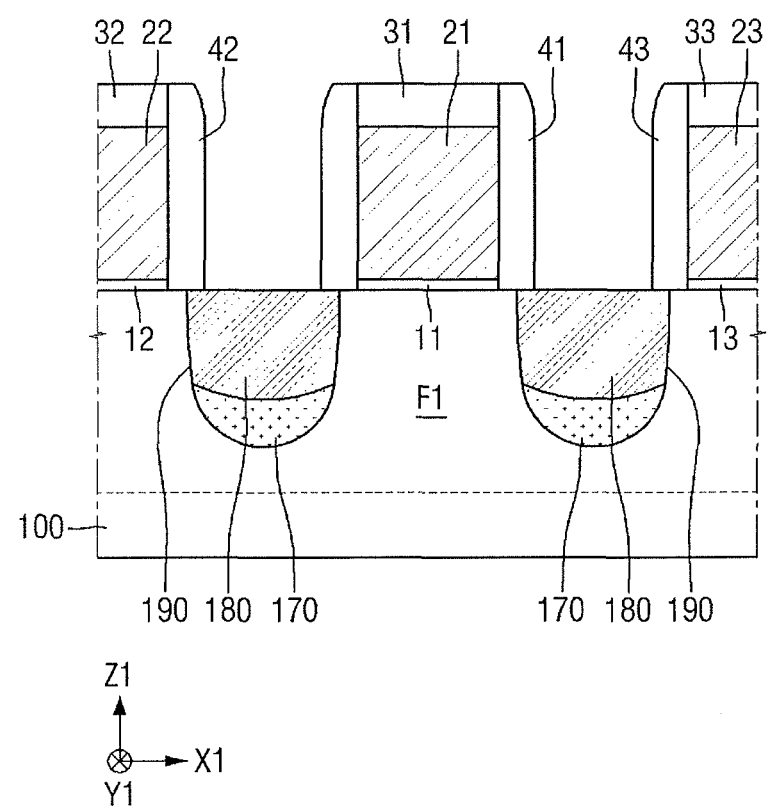

Next, referring to FIG. 18, the first trench 190 may form the second epitaxial layer 180 filling the first trench 190 (e.g., the remaining portions of the first trench 190).

The second epitaxial layer 180 may be formed on the first epitaxial layer 170. The second epitaxial layer 180 may also be formed with epitaxial growth, but may include a boron addition. Accordingly, a boron concentration of the second epitaxial layer 180 may be higher than a boron concentration of the first epitaxial layer 170.

In an implementation, a germanium concentration of the second epitaxial layer 180 may be higher than a germanium concentration of the first epitaxial layer 170. Due to characteristics of the epitaxial growth, it may be difficult to grow a silicon germanium layer of a high germanium concentration on the silicon bottom surface and side surface of the first trench 190.

In an implementation, the epitaxial layer may be grown into multi-films as illustrated in FIG. 8.

The formation of the first epitaxial layer 170 and the second epitaxial layer 180 of FIGS. 17 and 18 may involve a method of performing the epitaxial growth in-situ. As a result, the process condition such as impurity control, temperature, pressure, and so on may be adjusted in detail and the growth of the epitaxial layer into a desired volume may be obtained. Further, according to the continuity of the fabrication, fabrication cost and productivity may be enhanced.

Figure 19:
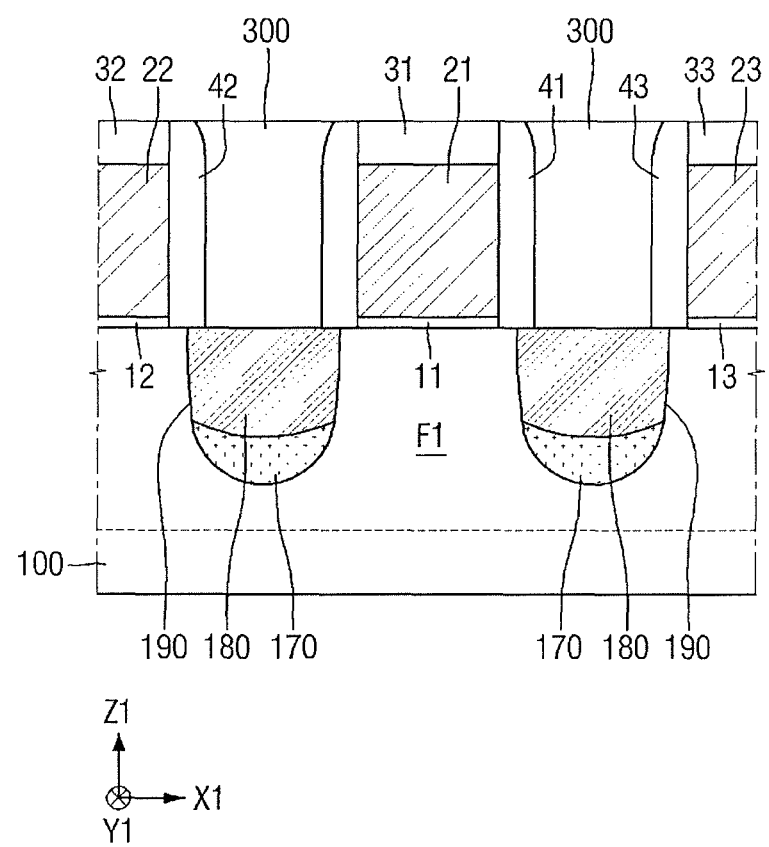

Next, referring to FIG. 19, the interlayer insulating film 300 may be formed.

In an implementation, as illustrated in FIG. 19, the interlayer insulating film 300 may have a same height as the upper surface of the first to third dummy capping films 31-33.

For example, as illustrated in FIG. 19, the interlayer insulating film 300 may be formed to cover the first to third dummy capping films 31-33, and may later expose the upper surfaces of the first to third dummy capping films 31-33 with the planarization process, or otherwise, remove the first to third dummy capping films 31-33 with the planarization process and expose the upper surface of the first to third dummy gate electrodes 21-23. In this case, a height of the upper surface of the interlayer insulating film 300 may be same as the upper surface of the first to third dummy gate electrodes 21-23. In this case, as a height of the first to third dummy gate spacers 41-43 decreases, the first to third dummy gate spacers 41-43 may become the first to third gate spacers 161-163 of FIG. 2.

Figure 20:
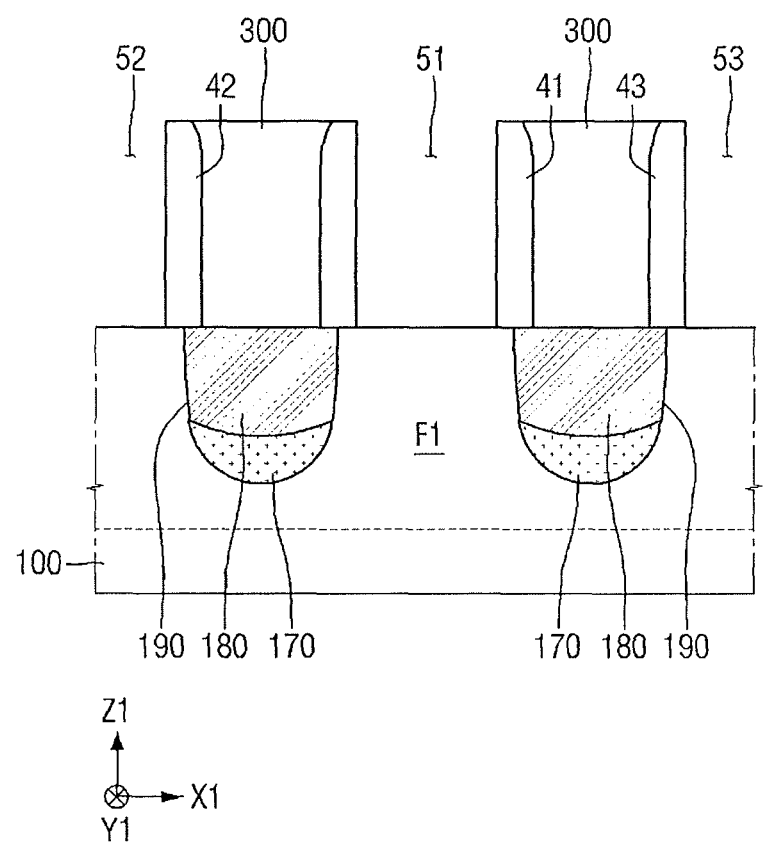

Next, referring to FIG. 20, the first to third dummy capping films 31-33, the first to third dummy gate electrodes 21-23, and the first to third dummy gate insulating films 11-13 may be removed.

Accordingly, the third to fifth trenches 51-53 may be formed. Third to fifth trenches 51-53 may extend in the second direction Y1. For example, the third trench 51 may be formed upon removal of a structure of the first dummy gate insulating film 11, the first dummy gate electrode 21, and the first dummy capping film 31. The fourth trench 52 may be formed upon removal of a structure of the second dummy gate insulating film 12, the second dummy gate electrode 22, and the second dummy capping film 32. The fifth trench 53 may be formed upon removal of a structure of the third dummy gate insulating film 13, the third dummy gate electrode 23, and the third dummy capping film 33.

In the method for fabricating the semiconductor device according to some exemplary embodiments, the first trench 190 may be in contact with the inner portions of the first to third dummy gate spacers 41-43, as in FIG. 7, as a portion of the inner walls of the first to third dummy gate spacers 41-43 is etched.

Next, referring to FIG. 2, on the third to fifth trenches 51-53, the first to third interfacial layers 111-113, the first to third high-k dielectric films 121-123, the first to third gate electrodes G1-G3, and the first to third capping films 151-153 may be formed.

For example, the first interfacial layer 111, the first high-k dielectric film 121, the first gate electrode G1, and the first capping film 151 may be formed in the third trench 51, the second interfacial layer 112, the second high-k dielectric film 122, the second gate electrode G2, and the second capping film 152 may be formed in the fourth trench 52, and the third interfacial layer 113, the third high-k dielectric film 123, the third gate electrode G3, and the third capping film 153 may be formed in the fifth trench 53.

Next, through a chemical mechanical polishing (CMP) process, a flat upper surface may be obtained by removing a portion of the first to third dummy gate spacers 41-43, a portion of the first to third capping films 151-153, and a portion of the interlayer insulating film 300. At this time, the first to third gate spacers 161-163 may be completed.

By way of summation and review, a multi-gate transistor may facilitate easy scaling, as it uses a three-dimensional channel. Further, current control capability may be enhanced without increasing a gate length of the multi-gate transistor. Furthermore, it is possible to effectively suppress short channel effect (SCE) which is the phenomenon that the electric potential of a channel region is influenced by a drain voltage.

The embodiments may provide a semiconductor device with improved operating characteristics.

The embodiments may provide a method for fabricating a semiconductor device with improved operating characteristics.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first fin protruding on a substrate and extending in a first direction;
   a first gate electrode on the first fin, the first gate electrode intersecting the first fin;
   a first trench formed within the first fin at a side of the first gate electrode;
   a first epitaxial layer filling a portion of the first trench, wherein a thickness of the first epitaxial layer becomes thinner closer to a sidewall of the first trench; and
   a second epitaxial layer filling the first trench on the first epitaxial layer,
   wherein a boron concentration of the second epitaxial layer is greater than a boron concentration of the first epitaxial layer.

2. The semiconductor device as claimed in claim 1, wherein:
   the first fin includes silicon, and
   the first epitaxial layer and the second epitaxial layer each include silicon germanium.

3. The semiconductor device as claimed in claim 2, wherein a germanium concentration of the first epitaxial layer is lower than a germanium concentration of the second epitaxial layer.

4. The semiconductor device as claimed in claim 1, wherein the first epitaxial layer includes:
   a first portion on a bottom surface of the first trench; and
   a second portion on a side surface of the first trench.

5. The semiconductor device as claimed in claim 4, wherein a thickness of the first portion is thicker than a thickness of the second portion.

6. The semiconductor device as claimed in claim 4, wherein the second portion is in contact with the first gate electrode.

7. The semiconductor device as claimed in claim 1, further comprising a third epitaxial layer between the second epitaxial layer and the first epitaxial layer, wherein a germanium concentration of the third epitaxial layer is lower than a germanium concentration of the second epitaxial layer.

8. The semiconductor device as claimed in claim 7, wherein a germanium concentration of the third epitaxial layer is higher than a germanium concentration of the first epitaxial layer.

9. The semiconductor device as claimed in claim 1, wherein an upper surface of the first epitaxial layer has a U shape in cross section.

10. The semiconductor device as claimed in claim 1, further comprising a first gate spacer on a sidewall of the first gate electrode, wherein the first trench is in contact with a lower surface of the first gate spacer.

* * * * *